United States Patent
McGrath, Jr. et al.

(10) Patent No.: US 9,568,499 B2
(45) Date of Patent: *Feb. 14, 2017

(54) HIGH PERFORMANCE LIGA SPRING INTERCONNECT SYSTEM FOR PROBING APPLICATION

(71) Applicant: Tektronix, Inc., Beaverton, OR (US)

(72) Inventors: James H. McGrath, Jr., Aloha, OR (US); Ira Pollock, Hillsboro, OR (US); David W. Simmen, Portland, OR (US)

(73) Assignee: TEKTRONIX, INC., Beaverton, OR (US)

( * ) Notice: Subject to any disclaimer, the term of this patent is extended or adjusted under 35 U.S.C. 154(b) by 581 days.

This patent is subject to a terminal disclaimer.

(21) Appl. No.: 14/088,210

(22) Filed: Nov. 22, 2013

(65) Prior Publication Data

US 2015/0145545 A1 May 28, 2015

(51) Int. Cl.
*H01R 12/88* (2011.01)
*G01R 1/067* (2006.01)
*H01R 12/81* (2011.01)
*H01R 12/82* (2011.01)

(52) U.S. Cl.
CPC .......... *G01R 1/06705* (2013.01); *H01R 12/81* (2013.01); *H01R 12/82* (2013.01); *H01R 12/88* (2013.01); *H01R 2201/20* (2013.01)

(58) Field of Classification Search
USPC .......................... 324/754.11, 755.05, 754.03, 754.07, 324/754.18, 754.14, 756.02, 756.05, 754.08, 324/755.01, 755.11, 750.24, 756.01; 439/260, 439/342, 67, 259, 495, 66, 629, 700, 81, 374, 439/729, 816, 862
See application file for complete search history.

(56) References Cited

U.S. PATENT DOCUMENTS

| | | | | |
|---|---|---|---|---|
| 6,712,630 | B1* | 3/2004 | Davidov | H01R 12/79 439/260 |
| 2008/0061808 | A1* | 3/2008 | Mok | C23C 26/00 324/754.14 |
| 2008/0102676 | A1* | 5/2008 | Johnson | H01R 12/88 439/260 |
| 2012/0187971 | A1* | 7/2012 | Huang | G01R 1/06722 324/755.05 |
| 2012/0238158 | A1* | 9/2012 | Yoshida | H01R 13/03 439/884 |

FOREIGN PATENT DOCUMENTS

DE   202012001645 U1   5/2013

OTHER PUBLICATIONS

Advanced Micro Nanosystems, vol. 7, "Liga and its applications", Edited by Volker Saile, 2009 Wiley-Vch Verlag GmbH & Co. KGaA.*
Extended European Search Report for European Patent Application No. 14194244.1, Apr. 15, 2015, 8 pages.

* cited by examiner

*Primary Examiner* — Melissa Koval
*Assistant Examiner* — Nasima Monsur
(74) *Attorney, Agent, or Firm* — Michael A. Nelson; Marger Johnson

(57) ABSTRACT

A zero insertion force (ZIF) connector can include a connector housing defining an opening and an interior space for receiving a mating member, multiple LIGA springs positioned within the interior space and configured to apply pressure to the mating member while in a first position, and a locking component to cause the LIGA springs to move to a second position responsive to a user pressing the locking component. The LIGA springs do not apply pressure to the mating member while in the second position.

19 Claims, 3 Drawing Sheets

HIGH PERFORMANCE LIGA SPRING INTERCONNECT SYSTEM FOR PROBING APPLICATION

TECHNICAL FIELD

This disclosure relates to signal processing systems and, more particularly, to connectors for such systems.

BACKGROUND

Current systems tend to be inadequate for solving custom requirements for solder-down tip solutions. Certain applications require bandwidth performance up to 28+ GHz with a reliable contact that is robust, miniature in size, and low-cost but, because certain types of probe tips must be able to accommodate up to six signals (e.g., two via coaxial connections and four via direct current), the use of standard radio frequency (RF) connectors and cables would not provide an acceptable customer solution. Indeed, no current systems or devices meet these needs.

Accordingly, a need remains for an interconnector system suitable for use with such probe tips.

DETAILED DESCRIPTION

Radio frequency (RF) connector suppliers have been developing a process to create high performance microsprings. Such springs are typically fabricated by way of a process referred to herein as "LIGA" (which is short for Lithographie, Galvanoformung, and Abformung). LIGA processing generally consists of three main processing steps: lithography, electroplating, and molding. There are two main types of LIGA-fabrication technologies: x-ray LIGA, which uses X-rays produced by a synchrotron to create high-aspect ratio structures, and ultraviolet (UV) LIGA, which is a more accessible method that uses UV light to create structures having relatively low aspect ratios.

Embodiments of the disclosed technology are generally directed to the use of LIGA springs as part of a new interconnect system for probing applications that would allow for multiple signal types while being flexible and miniature in size while reducing the cost thereof from that of a typical RF connector system. Given the small size and significant range of performance, such an interconnect system could be standardized for an entire probe platform, thus allowing for a common set of probe accessories across multiple product lines.

Figure 1:
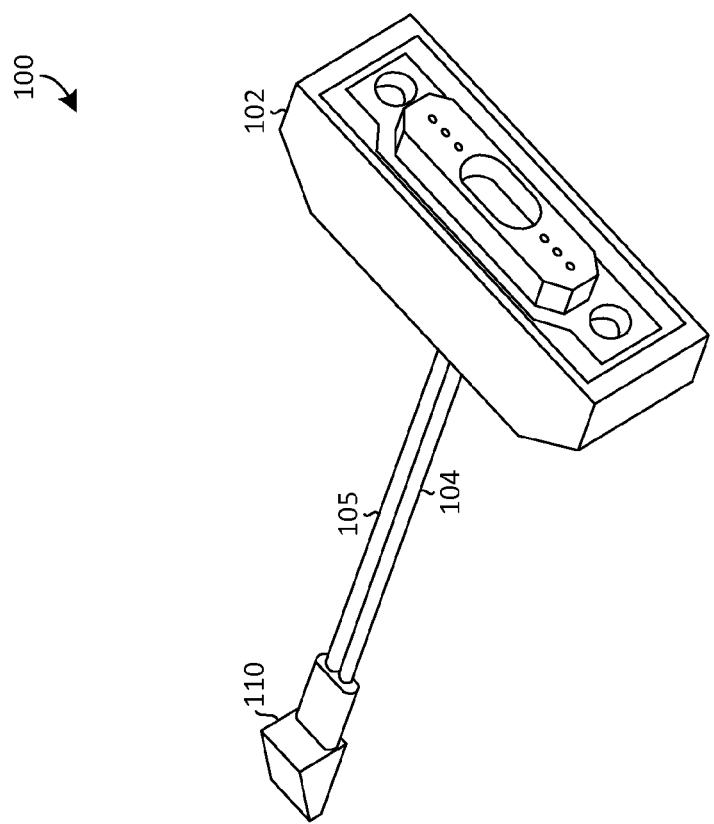
FIG. 1 illustrates an example of an interconnect system in accordance with certain embodiments of the disclosed technology.
Figure 1:
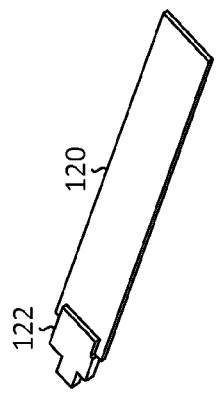

FIG. 1 illustrates an example of an interconnect system 100 in accordance with certain embodiments of the disclosed technology. In the example, the system 100 includes a first connector 102 suitable for connecting to an electronic device such as an oscilloscope.

The system 100 also includes a zero insertion force (ZIF) connector 110, e.g., a high-bandwidth connector, suitable for connecting to a flex circuit 120. Such connection may include multiple contacts. Connecting members 104 and 105, such as coaxial cables and/or direct current (DC) lines, serve to electrically couple the first connector 102 with the ZIF connector 110.

While FIG. 1 shows only two connecting members 104 and 105, there may be more than two connecting members in other embodiments. For example, the interconnect system 100 may include eight to ten connecting members consisting of two coaxial lines and six to eight DC lines. In certain embodiments, the connecting members 104 and 105 may be bundled together as a single connective unit, e.g., by way of a protective encasing, between the first connector 102 and the ZIF connector 110.

In the example, the flex circuit 120 has a connecting portion 122 that is suitable for connecting, e.g., by way of soldering, to multiple connection points on at least one circuit board of a device under test (DUT), for example. In this manner, engineers may debug a particular circuit on a circuit board of the DUT.

In certain embodiments, the DUT may have multiple flex circuits attached thereto such that a user may quickly and efficiently test various portions or aspects of the DUT by connecting the ZIF connector 110 to—and acquiring data from—any or all of the flex circuits one at a time, e.g., sequentially.

The ZIF connector 110 may have positioned therein multiple LIGA springs that are suitable for establishing and maintaining electrical contact with portions, e.g., connection points, of the flex circuit 120 so long as the flex circuit 120 is engaged with, e.g., remains inserted in, the ZIF connector 110.

Figure 2:
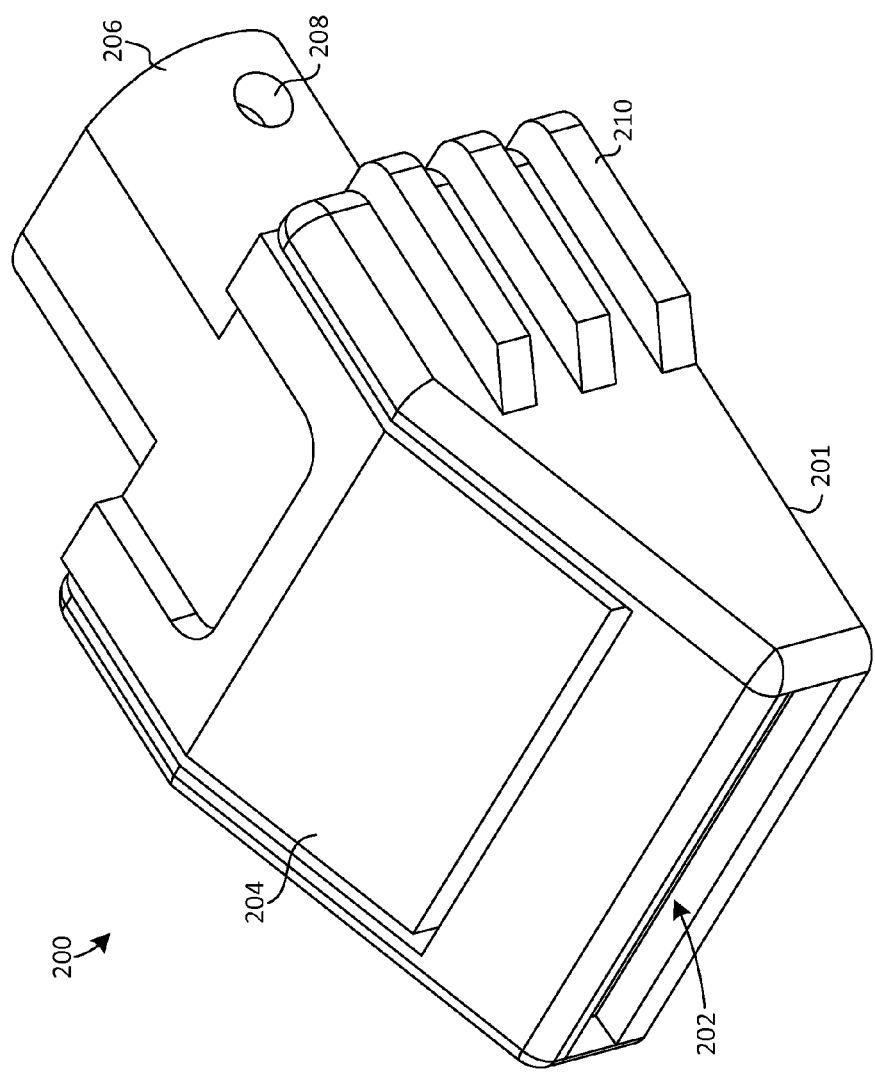
FIG. 2 illustrates an example of a ZIF connector, such as the ZIF connector of FIG. 1, in accordance with certain embodiments of the disclosed technology.

FIG. 2 illustrates an example of a ZIF connector 200, such as the ZIF connector 110 of FIG. 1, in accordance with certain embodiments of the disclosed technology. In the example, the ZIF connector 200 has a housing 201, e.g., a metal housing, that defines an opening 202, e.g., a slotted opening, and an interior space that are both suitable for receiving a mating member, e.g., a flex circuit such as the flex circuit 120 of FIG. 1.

The ZIF connector 200 has a locking component 204 suitable for facilitating the mating of a mating member, e.g., a flex circuit, with the ZIF connector 200. In certain embodiments, a user may press the locking component 204 and, responsive thereto, multiple LIGA springs positioned within the interior space may move or be caused to be moved to an "open" position such that the user (or another party) may easily insert the mating member through the opening 202 and into the interior portion of the ZIF connector 200.

Responsive to the user releasing the locking component 204, the LIGA springs positioned in the interior space may move or be caused to be moved to a "closed" positioned such that they make contact with—while concurrently applying pressure to—the mating member. In certain embodiments, the LIGA springs may also establish at least one electrical connection with the mating member and maintain the electrical connection(s) so long as the mating member remains secured within—and mated with—the ZIF connector 200.

In the example, the ZIF connector 200 includes a rear portion 206 suitable for receiving—or otherwise mating with—a connecting member such as the connecting members 104 and 105 of FIG. 1. The rear portion 206 may include an optional side hole 208 or multiple side holes suitable to be used as an attachment point for accessories such as active probe tips, passive probe tips, and browsers, for example. In place of or in addition to the side hole(s) 208, optional support ribs 210 may be used as an attachment point for accessories such as those noted above.

Figure 3:
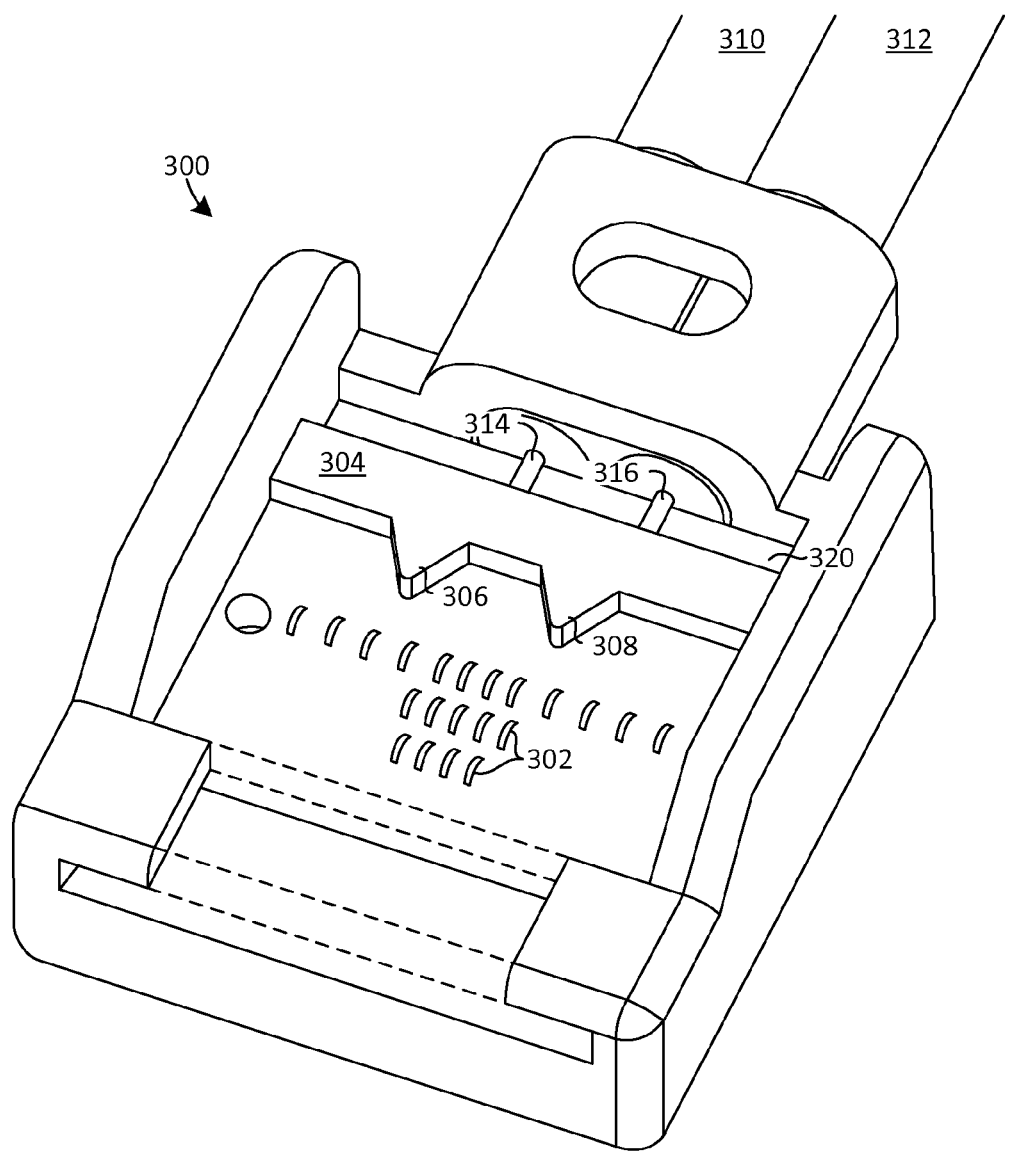
FIG. 3 illustrates a cutaway view of a ZIF connector, such as the ZIF connector of FIG. 2, in accordance with certain embodiments of the disclosed technology.

FIG. 3 illustrates a cutaway view of a ZIF connector 300, such as the ZIF connector 200 of FIG. 2, in accordance with certain embodiments of the disclosed technology. In the cutaway example, one can see multiple LIGA springs 302 within a housing 301, e.g., a metal housing, of the ZIF connector 300.

The LIGA springs 302 may include DC springs, signal springs, ground springs, or any suitable combination thereof. Any or all of the LIGA springs 302 may have a generally helical shape, a cantilever shape, or a combination thereof depending on the production process used and/or intended application of the ZIF connector, for example.

Also within the ZIF connector 300 is a spring housing 304 and multiple positioning portions 306 and 308 (also referred to herein as positioning keys) configured to align a mating member, such as a flex circuit, within the interior portion of the ZIF connector 300 while the mating member is within the interior portion. While the example illustrates two positioning portions 306 and 308, certain embodiments may include more than two positioning portions.

Two connecting members 310 and 312 serve to provide an electrical connection between the ZIF connector 300 and another connector such as the first connector 102 of FIG. 1, for example. In the example, the connecting members 310 and 312 are coaxial lines having corresponding coaxial launches 314 and 316, respectively, that may serve to electrically couple with a circuit board 320 that is situated underneath the LIGA springs 302 and the spring housing 304. In other embodiments, there may be more than two connecting members, e.g., two coaxial lines and six to eight DC lines, connecting the ZIF connector 300 to the other connector.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

We claim:

1. A zero insertion force (ZIF) connector for probing applications, comprising:
   a connector housing defining an opening and an interior space suitable for receiving one of a plurality of mating members that are each physically and electrically coupled with a corresponding device under test (DUT);
   a plurality of LIGA springs positioned within the interior space and configured to apply pressure to the mating member while in a first position, wherein each of the plurality of LIGA springs facilitates an electrical connection between one of a plurality of connection points on the mating member and a probe; and
   a locking component configured to cause the plurality of LIGA springs to move to a second position responsive to a user pressing the locking component, wherein the plurality of LIGA springs do not apply pressure to the mating member while in the second position, wherein the locking component is further configured to cause the plurality of LIGA springs to move back to the first position responsive to the user releasing the locking component.

2. A zero insertion force (ZIF) connector for probing applications, comprising:
   a connector housing defining an opening and an interior space suitable for receiving one of a plurality of mating members that are each physically and electrically coupled with a corresponding device under test (DUT);
   a plurality of LIGA springs positioned within the interior space and configured to apply pressure to the mating member while in a first position, wherein each of the plurality of LIGA springs facilitates an electrical connection between one of a plurality of connection points on the mating member and a probe; and
   a locking component configured to cause the plurality of LIGA springs to move to a second position responsive to a user pressing the locking component, wherein the plurality of LIGA springs do not apply pressure to the mating member while in the second position, wherein the plurality of LIGA springs remain in the second position so long as the user continues to press the locking member.

3. The ZIF connector of claim 2, wherein the opening is a slotted opening.

4. The ZIF connector of claim 3, wherein the mating member is a flex circuit.

5. The ZIF connector of claim 2, wherein each of the plurality of LIGA springs has a generally helical shape or a cantilever shape.

6. The ZIF connector of claim 2, wherein the plurality of LIGA springs are generated by way of an x-ray fabrication technique.

7. The ZIF connector of claim 2, wherein the plurality of LIGA springs are generated by way of an ultraviolet (UV) light fabrication technique.

8. The ZIF connector of claim 2, further comprising a rear portion configured to receive at least one connecting member.

9. The ZIF connector of claim 8, wherein the connecting member includes at least one coaxial line, at least one direct current (DC) line, or both at least one coaxial line and at least one DC line.

10. The ZIF connector of claim 9, wherein the at least one connecting member includes two or more connecting members and further wherein a protective encasing encases the two or more connecting members.

11. The ZIF connector of claim 8, wherein the rear portion defines at least one side hole configured to be used as an attachment point for an accessory.

12. The ZIF connector of claim 11, wherein the accessory is an active probe tip, a passive probe tip, or a browser.

13. The ZIF connector of claim 8, further comprising a plurality of support ribs integrated with the rear portion, wherein the plurality of ribs is configured to be used as an attachment point for an accessory.

14. The ZIF connector of claim 13, wherein the accessory is an active probe tip, a passive probe tip, or a browser.

15. The ZIF connector of claim 2, further comprising a plurality of positioning portions within the interior space, wherein the plurality of positioning portions are configured to align the mating member within the interior space.

16. An interconnect system, comprising:
   a test instrument;
   a device under test (DUT);
   a mating member that is physically and electrically coupled with the DUT; and
   a zero insertion force (ZIF) connector electrically coupled between the test instrument and the DUT, the ZIF connector including:
   a connector housing defining an opening and an interior space suitable for receiving the mating member;
   a plurality of LIGA springs positioned within the interior space and configured to apply pressure to the mating member while in a first position; and
   a locking component configured to cause the plurality of LIGA springs to move to a second position responsive to a user pressing the locking component, wherein the plurality of LIGA springs do not apply pressure to the mating member while in the second position, and wherein the plurality of LIGA springs remain in the second position so long as the user continues to press the locking member.

17. The interconnect system of claim 16, wherein the test instrument is an oscilloscope.

18. The interconnect system of claim 16, wherein the mating member is a flex circuit.

19. The interconnect system of claim 16, further comprising a plurality of connecting members electrically coupled between the ZIF connector and the test instrument.

* * * * *